United States Patent [19]

Julie

[11] 3,723,892

[45] Mar. 27, 1973

[54] CIRCUIT USING DYNAMIC HIGH IMPEDANCE LOAD

[75] Inventor: Loebe Julie, New York, N.Y.

[73] Assignee: Julie Research Laboratories, Inc., New York, N.Y.

[22] Filed: Mar. 22, 1972

[21] Appl. No.: 236,823

Related U.S. Application Data

[63] Continuation-in-part of Ser. No. 57,140, July 22, 1970.

[52] U.S. Cl. ....................................330/35, 330/24

[51] Int. Cl. ............................................H03f 3/16

[58] Field of Search .............330/35, 24, 70; 307/304

[56] References Cited

UNITED STATES PATENTS

| | | | |
|---|---|---|---|
| 2,920,279 | 1/1960 | Speller | 330/70 |
| 3,024,422 | 3/1962 | Jansson | 330/35 UX |

*Primary Examiner*—Roy Lake
*Assistant Examiner*—James B. Mullins
*Attorney*—Eliot S. Gerber

[57] ABSTRACT

An amplifier comprising a series of field effect transistors is connected to a dynamic high impedance load. The output of the amplifier preferably is taken from the last stage of that load. The dynamic high impedance load may be a constant current source consisting of at least three field effect transistors.

9 Claims, 3 Drawing Figures

CIRCUIT USING DYNAMIC HIGH IMPEDANCE LOAD

This application had co-pending with U.S. application Ser. No. 57,140, filed July 22, 1970, and now abandoned and having the title Circuit Using Dynamic High Impedance Load.

The present invention relates to electronic circuitry and more specifically to a stable amplifier using a dynamic high impedance load.

The field of electronic amplification circuits is one which has received a great deal of attention over the years, as the amplifier is a basic element in electronic circuitry. Generally the goals of amplifier design are to produce an amplifier which is linear in the sense that its output signal is a linear facsimile of the input signal, which does not introduce noise into the amplified signal, which is low in cross-modulation, and which is low in power consumption. The problem of finding a suitable amplifier circuit has been particularly serious in high gain amplifiers which are capable of amplifying signals having a frequency of zero cycles per second. In general, d.c. amplifiers are used to amplify the output of transducers, for example, transducers which produce an electrical signal in response to changes in heat, vibration, speed and distance.

It has been suggested that an amplifier may be made by cascading a number of field effect transistors. Specifically, enhancement type unipolar metal-oxide-semiconductor field effect transistors (called MOS-FET) have been directly coupled in a cascade circuit to produce an amplifier. In that circuit the signal is taken to the gate of the first MOS-FET and the drain of the first MOS-FET is connected to the gate of the second. Similarly, the drain of the second MOS-FET is connected to the gate of the third MOS-FET and the signal is taken from the drain of the third MOS-FET and the sink of the third MOS-FET which is common to the sinks of the second and first MOS-FET and to the input signal. This type of circuit is not entirely satisfactory, however, particularly because it is not entirely stable.

Various circuits and devices have been proposed for providing a dynamic high impedance load which provides a constant current source when the current is derived from a power source which varies. Such a load provides a constant impedance under dynamic conditions, for example, when connected to an amplifier whose output varies. The current which is obtained by rectification of the power line alternating current, or even current which is obtained from a battery source, is not sufficiently stable for use in many applications. Particularly in high accuracy measurements utilizing bridge circuits, it is essential that the current be stable and prcise over time, and not affected by variations in temperature, humidity, and other environmental circumstances. As another example, a constant current is necessary for accurate tuning in certain radio applications. Variations in current would mean in the first example of a measuring system, that the measurements would not be centered on the desired frequency.

One approach to providing a constant current has been to attempt to provide a stable power source. Generally such stability has been sought by using special and expensive batteries which are maintained at a constant temperature. This approach has the disadvantage that such batteries, and their temperature chambers, are relatively complex and expensive, that the batteries have a limited life span, and that the apparatus is generally bulky and cumbersome. Another approach has been to provide for electronic circuitry using transistors which seek to compensate for changes in the environment; for example, the circuitry might encompass elements which have a negative coefficient with temperature changes to compensate if the circuit has a positive coefficient. Similarly, the effects of aging, humidity or other environmental circumstances were attempted to be predicted and compensated for in advance. These circuits generally are somewhat complex and expensive and, in addition, may not provide the desired accuracy because certain environmental conditions are difficult to accurately predict or compensate.

It is an objective of the present invention to provide an amplifier having a low noise figure, high stability, and low cross-modulation.

It is another objective of the present invention to provide a high gain amplifier which is capable of operation at direct current as well as at high frequencies.

It is another objective of the present invention to provide a circuit which provides a constant high impedance load regardless of changes in the ambient environment.

In accordance with the present invention, a dynamic high impedance load circuit is provided. That circuit is utilized as the high impedance load for an amplifier circuit. Specifically, the high impedance circuit is a series of three field effect transistors which are connected in a specific configuration, with the connection being from the drain of the first MOS-FET to the gate of the second. The amplifier consists of a series of MOS-FET's connected in a specific configuration. The amplifier is connected to one end of the high impedance load. The output of the amplifier is preferably taken from the last stage of the high impedance load.

Other objectives of the present invention will be apparent from the following detailed description giving the inventor's best mode of practicing the invention. In the drawings.

Figure 1:
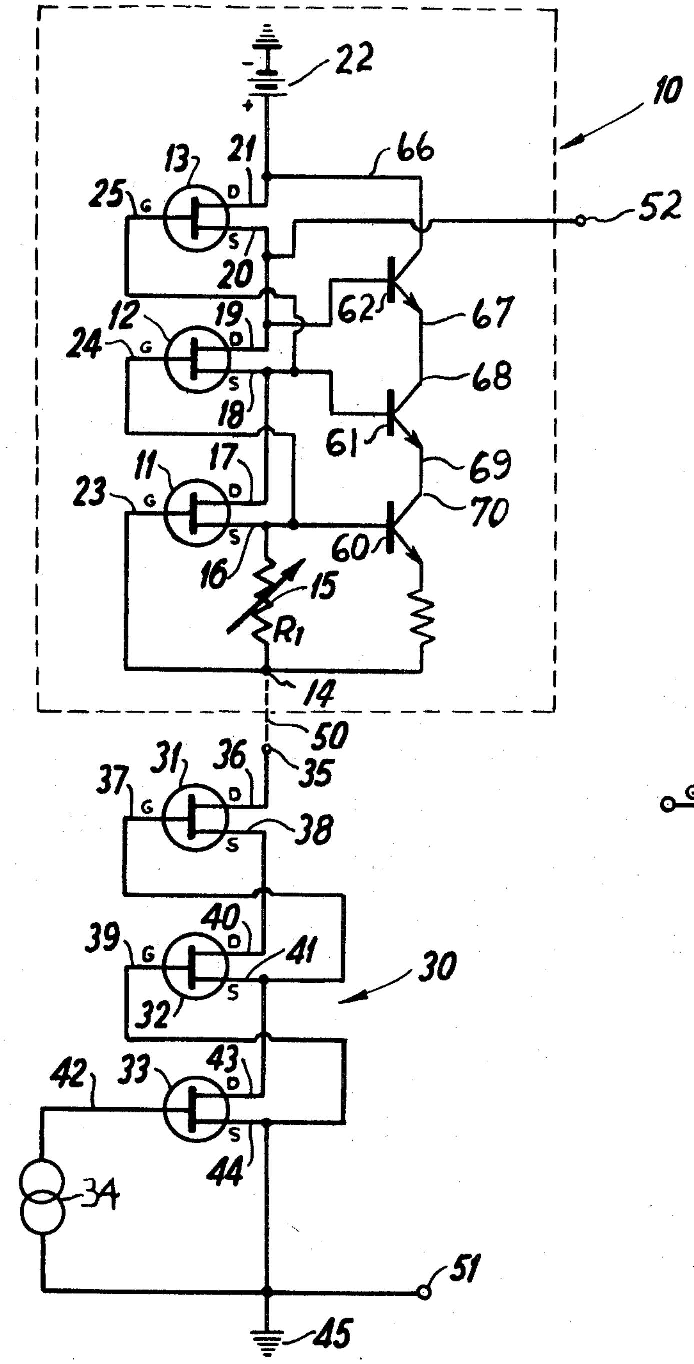
FIG. 1 is a schematic diagram showing both the high impedance load circuit and the amplifier circuit of the present invention.

The field effect transistor is a unipolar device. Its operation is by a function of only one type of charge carrier, with holes in the P-channel device or electrons in the N-channel device. As shown in the enclosed figure, the metal-oxide-semiconductor field effect transistors (MOS-FET) 11, 12, 13, 31, 32 and 33 are preferably all of the same type. However, it will be understood that different types may be used. The presently available types of MOS-FET's are the N-channel depletion type, the N-channel enhancement type, the P-channel depletion type and the P-channel enhancement type.

The dynamic high impedance load 10, which is a constant current source, is shown within the dash-dot lines. It consists of the three MOS-FET devices 11, 12 and 13, although additional MOS-FET's may be connected, as are the devices 11, 12 and 13, for an even more stable current control. The input terminal 14 is connected to the gate 23 of MOS-FET 11. The terminal 14 is also connected to one end of the adjustable resistance 15 whose opposite end is connected to the sink 16 of MOS-FET 11. The drain 17 of MOS-FET 11 is connected to the sink 18 of MOS-FET 12. The sink 16 of MOS-FET 11 is connected to the gate 24 of MOS-FET 12. The sink 18 of MOS-FET 12 is connected to the gate 25 of MOS-FET 13. The drain 19 of MOS-FET 12 is connected to the sink 20 of MOS-FET 13. The drain 21 of MOS-FET 13 is connected to the positive terminal of current source 22.

The amplifying circuit 30 is shown at the bottom of FIG. 1. The amplifying circuit 30 is designed to be connected to a high impedance load which remains constant under dynamic conditions. An example of such a high impedance load is the circuit 10. The amplifying circuit 30 includes the input source 34 which is connected to terminal 35 and to ground 45. The terminal 35 is connected to the gate 42 of MOS-FET 33, which is connected in a common-source arrangement, with the input applied between the gate and the source. The gate 37 of MOS-FET 31 is connected to the sink 41 of MOS-FET 32. The sink 38 of MOS-FET 32 is connected to the sink 44 of MOS-FET 33 and also to the ground terminal 45.

The high impedance circuit 10 provides a dynamic high impedance load for the amplifier, as well as providing a constant current. For example, with a current of 1 milliamp and a voltage of 5 volts, the resistance 15 may be set at 1,000 ohms. A major advantage of the high impedance circuit 10 is that the source-drain voltage is held constant at MOS-FET 11 by means of the subsequent MOS-FET's 12 and 13. Since the source-drain voltage of MOS-FET 11 is maintained constant, its current likewise is maintained constant, and presents a constant current at the terminal 14.

When the terminal 14 is connected, as shown by the dash lines 50, to the terminal 35 so that the circuit 30 is utilized as a dynamic high impedance load for the amplifier, the variable resistance 15 would be removed from the circuit.

The dynamic impedance across the drain-sink of MOS-FET 11 is $\mu R1 + rds$ where $\mu$ is the amplification factor of MOS-FET 11 and R1 the impedance of variable resistor 15 and rds the active channel resistance, in this case the resistance of gate 24 of MOS-FET 12. Similarly, the dynamic impedance across drain-sink of MOS-FET 12 $\mu'(\nu R1 + rds) + r'ds$ where $\mu'$ is the amplification factor of MOS-FET 12 and $R'ds$ is its active channel resistance, namely, the gate 25 connection to MOS-FET 13. In the same manner, the dynamic impedance across drain-sink of MOS-FET 13 is $v''$ ($v'$ ($\nu R1 + rds$) where $\mu''$ is the amplification factor of MOS-FET 13. If the amplification of each MOS-FET is in the order of 100 (and ignoring the resistances) then the total amplification would be in the order of $100 \times 100 \times 100 = 1{,}000{,}000$.

The amplifier output is at terminal 51 to a load of, for example, 20,000 ohms. Terminal 51 is common with the input, and at terminal 52, which is connected to sink 20. If the output were taken at terminal 14, very little, if any, amplification would occur. Preferably the output should be taken from the last stage of the high impedance load.

The transistors 60, 61 and 62 are regular solid-state three-terminal NPN transistors. They are connected so that their bases are respectively connected to the respective sinks 16, 18 and 20. The collector 66 of transistors 62 is connected to drain 21 and the positive terminal of current source 22 and its emitter 67 is connected to collector 68 of transistor 61.

Figure 3:
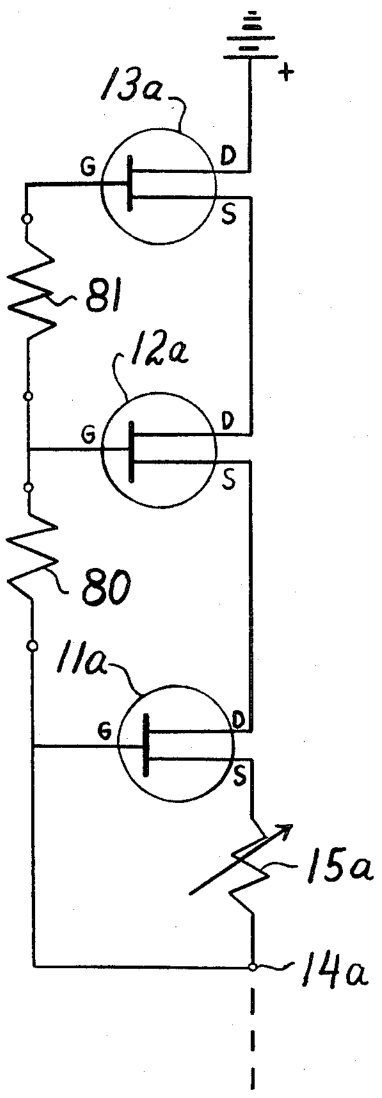
FIG. 3 is a schematic diagram of an alternative high impedance load circuit.

Emitter 69 (of transistor 61) is connected to collector 70 (of transistor 60). This string of transistors 60, 61 and 62 permits the current from source 22 to terminal 14 to be more accurately set and maintained. An alternative circuit for accurately setting and maintaining the current from source 22 to terminal 14 is shown in FIG. 3. As shown in FIG. 3, the string of FET transistors 11*a*, 12*a*, 13*a* are connected, at their gates, to tapped resistors which are resistors 80 and 81. The resistors 80 and 81 are selected to give the desired bias voltage, as explained below.

In MOS-FET's the voltage gain G*r* equals $gm \cdot rds$, where gm is the dynamic transconductance and rds is active channel resistance. In the normal operating region, to obtain reasonable gain, the voltage (drain to gate) is equal to, or greater than, twice the pinch-off voltage. The pinch-off voltage $V_P$ is the gate cut-off voltage $V_G$ (off) that reduces the drain current to one per cent of its zero gate voltage value at the drain-to-source voltage at the "knee" (before the pinch-off region). The gain ($\mu$) for MOS-FET's, when so operated, is in the order of 50–100. The bias voltage, i.e., the voltage gate to source, is less than, or equal to, the pinch-off voltage. The bias voltage (gate to source) on MOS-FET 12 is less than the pinch-off voltage on MOS-FET 11. The voltage drain to source on MOS-FET 13 is greater than the pinch-off voltage (the gate voltage on MOS-FET 13). Similarly the voltage drop across MOS-FET 11 (drain to source) is greater than the voltage at gate 24 (the gate on MOS-FET 12). This grading of voltage is required for operation of the MOS-FET's in their normal operating ranges. The proper voltage conditions are established when $V_P$ (pinch-off voltage) of MOS-FET 13 is higher than $V_P$ of MOS-FET 12, which in turn is higher than $V_P$ of MOS-FET 11. It is possible to obtain MOS-FET's having different pinch-off voltages. However, the alternative, shown in FIG. 3, is to use the same type of MOS-FET's at 11*a*, 12*a* and 13*a* and to connect their gates to tapped resistors (resistors 80 and 81), providing the necessary voltage gradients.

Figure 2:
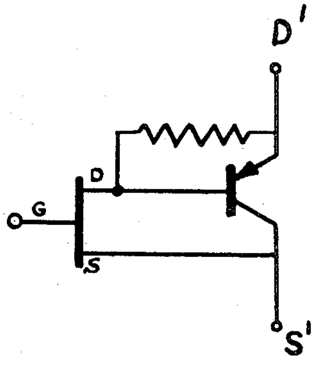
FIG. 2 is a schematic diagram showing a circuit equivalent to a FET.

MOS-FET's have limited current carrying capabilities. It is possible to improve the current carrying capability of the circuit by a Darlington type equivalent FET, in which a high current carrying three-terminal transistor would be connected as in FIG. 2. Alternatively, other circuits, giving the equivalent electrical properties of a FET but with higher current carrying capability, may be used.

I claim:

1. Am amplifying circuit consisting of three terminals with the first two terminals adapted to be connected to the source of signals to be amplified, a high dynamic impedance load connected to said third terminal, the output being taken from said load, at least three field effect transistors each having a control gate and two terminals across which the impedance is varied by said gate, one variable impedance terminal of the first transistor being connected to said high impedance load, the gate of said first transistor being connected to the first variable impedance terminal of said second transistor, the other variable impedance terminal of the first transistor being connected to the second variable impedance terminal of the second transistor, the gate of said second transistor being connected to the first variable impedance terminal of said third transistor, the first variable impedance terminal of said second transistor being connected to the second variable impedance terminal of said third transistor, and the first and second terminals being respectively connected to the gate and first variable impedance terminals of said third transistor.

2. An amplifying circuit as in claim 1 wherein said high dynamic impedance load consists of a resistor having first and second terminals with its first terminal connected to said first transistor as its input terminal, at least three load field effect transistors each having a control gate to vary the impedance across its two other variable impedance terminals, the gate of the first load field effect transistor being connected to said input terminal, a variable impedance terminal of said first load transistor being connected to said second resistor terminal and to the gate of said second load transistor, the other variable impedance terminal of the first load transistor being connected to the gate of the third load transistor and to one variable impedance terminal of the second load transistor, the other variable impedance terminal of the second load transistor being connected to a variable impedance terminal of the third load transistor.

3. An amplifying circuit as in claim 1 wherein the high dynamic impedance load further includes three transistors connected in series, with the impedance of each transistor controlled by a base, the base of each transistor being connected to a variable impedance terminal of one of the load field effect transistors.

4. An amplifying circuit as in claim 1 wherein said high impedance load has a high impedance load output terminal and a low impedance load output terminal and the output is taken from the high impedance load output terminal.

5. An amplifying circuit as in claim 1 wherein the said high dynamic impedance load consists of at least two load field effect transistors with the gate of the first load transistor being connected to said third terminal and a variable impedance terminal of said first load transistor being connected to the gate of the second transistor.

6. The circuit of claim 5 wherein an adjustable resistor is connected between said third terminal and said variable impedance terminal of said first load transistor.

7. The circuit of claim 5 wherein the field effect transistors are metal-oxide-semiconductors.

8. A circuit providing a high dynamic impedance load and including an input terminal, a resistor having first and second terminals with its first terminal connected to said input terminal, at least three field effect transistors each having a control gate to vary the impedance across its two other variable impedance terminals, the gate of the first field effect transistor being connected to said input terminal, a variable impedance terminal of said first transistor being connected to said second resistor terminal and to the gate of said second transistor, the other variable impedance terminal of the first transistor being connected to the gate of the third transistor and to one variable impedance terminal of the second transistor, the other variable impedance terminal of the second transistor being connected to a variable impedance terminal of the third transistor, wherein the pinch-off voltage of said third transistor is higher than the pinch-off voltage of said second transistor and the pinch-off voltage of said second transistor is higher than the pinch-off voltage of said first transistor.

9. A circuit providing a high dynamic impedance load and including an input terminal, a first resistor having first and second terminals with its first terminal connected to said input terminal,at least three field effect transistors each having a control gate to vary the impedance across its two other variable impedance terminals, second and third resistors connected in series and each having first and second terminals, the gate of the first field effect transistor being connected to said input terminal, a variable impedance terminal of said first transistor being connected to said second resistor terminal, the other variable impedance terminal of the first transistor being connected to one variable impedance terminal of the second transistor, the other variable impedance terminal of the second transistor being connected to a variable impedance terminal of the third transistor; wherein the gate of the first transistor is connected to the first terminal of the second resistor, the gate of the second transistor is connected to the second terminal of the second resistor and to the first terminal of the third resistor and the gate of the third transistor is connected to the second terminal of the third resistor.

* * * * *